(12) United States Patent
Yavas et al.

(10) Patent No.: US 12,303,976 B2
(45) Date of Patent: May 20, 2025

(54) ADDITIVE MANUFACTURING DEVICE

(71) Applicant: TUSAS-TURK HAVACILIK VE UZAY SANAYII ANONIM SIRKETI, Kahramankazan/Ankara (TR)

(72) Inventors: Hakan Yavas, Ankara (TR); Ahmet Alptug Tanrikulu, Ankara (TR)

(73) Assignee: TUSAS- TURK HAVACILIK VE UZAY SANAYII ANONIM SIRKETI, Kahramankazan/Ankara (TR)

( * ) Notice: Subject to any disclaimer, the term of this patent is extended or adjusted under 35 U.S.C. 154(b) by 611 days.

(21) Appl. No.: 17/633,503

(22) PCT Filed: Aug. 25, 2020

(86) PCT No.: PCT/TR2020/050750
§ 371 (c)(1),
(2) Date: Feb. 7, 2022

(87) PCT Pub. No.: WO2021/040656
PCT Pub. Date: Mar. 4, 2021

(65) Prior Publication Data
US 2022/0288687 A1    Sep. 15, 2022

(30) Foreign Application Priority Data
Aug. 29, 2019   (TR) .................. 2019/13132

(51) Int. Cl.
*B22F 10/20*        (2021.01)
*B22F 10/28*        (2021.01)
(Continued)

(52) U.S. Cl.
CPC ............ *B22F 12/222* (2021.01); *B22F 10/28* (2021.01); *B22F 10/50* (2021.01); *B22F 12/70* (2021.01);
(Continued)

(58) Field of Classification Search
CPC ...... B22F 2202/05; B22F 10/28; B22F 12/90; H01J 37/3405; B33Y 30/00; B33Y 40/00
See application file for complete search history.

(56) References Cited

U.S. PATENT DOCUMENTS

| | | | |
|---|---|---|---|
| 2004/0104203 A1* | 6/2004 | Yamaguchi | B23K 5/22 219/121.36 |
| 2014/0037983 A1 | 2/2014 | Godfrey et al. | |

(Continued)

FOREIGN PATENT DOCUMENTS

| | | |
|---|---|---|
| CN | 107570705 A | 1/2018 |
| CN | 110011045 A | 7/2019 |

(Continued)

OTHER PUBLICATIONS

International Search Report for corresponding PCT application No. PCT/TR2020/050750, mailed Sep. 3, 2021.

(Continued)

*Primary Examiner* — Anthony M Liang
(74) *Attorney, Agent, or Firm* — Notaro, Michalos & Zaccaria P.C.

(57) ABSTRACT

A body and a table that is located on the body and allows powders to be laid thereon by a laying apparatus is disclosed. At least one layer is created by sintering or fusing the powders laid on the table, a part is produced by depositing the layers using an additive manufacturing method, at least one heat source assembly that is located on the body and applies heat treatment to the powders laid on the table, at least one sensor for measuring position and operating status of the heat source assembly, and at least one control unit controlling the heat source assembly based on data received from the sensor.

14 Claims, 13 Drawing Sheets

(51) Int. Cl.
   *B22F 10/50*   (2021.01)
   *B22F 12/00*   (2021.01)
   *B22F 12/70*   (2021.01)
   *B22F 12/90*   (2021.01)
   *B33Y 10/00*   (2015.01)
   *B33Y 30/00*   (2015.01)
   *B33Y 40/00*   (2020.01)
   *B22F 10/36*   (2021.01)

(52) U.S. Cl.
   CPC .............. *B22F 12/90* (2021.01); *B33Y 10/00* (2014.12); *B33Y 30/00* (2014.12); *B33Y 40/00* (2014.12); *B22F 10/36* (2021.01); *B22F 2202/05* (2013.01)

(56) References Cited

U.S. PATENT DOCUMENTS

2018/0319703 A1\* 11/2018 Boyum ................. C23C 14/083
2020/0147687 A1\*  5/2020 Connor ................... B22F 12/50

FOREIGN PATENT DOCUMENTS

EP           2551041 A2       1/2013
JP           H-08199354 A  \*  8/1996

OTHER PUBLICATIONS

International Preliminary Report on Patentability for corresponding PCT application No. PCT/TR2020/050750, completed Dec. 21, 2021.

\* cited by examiner

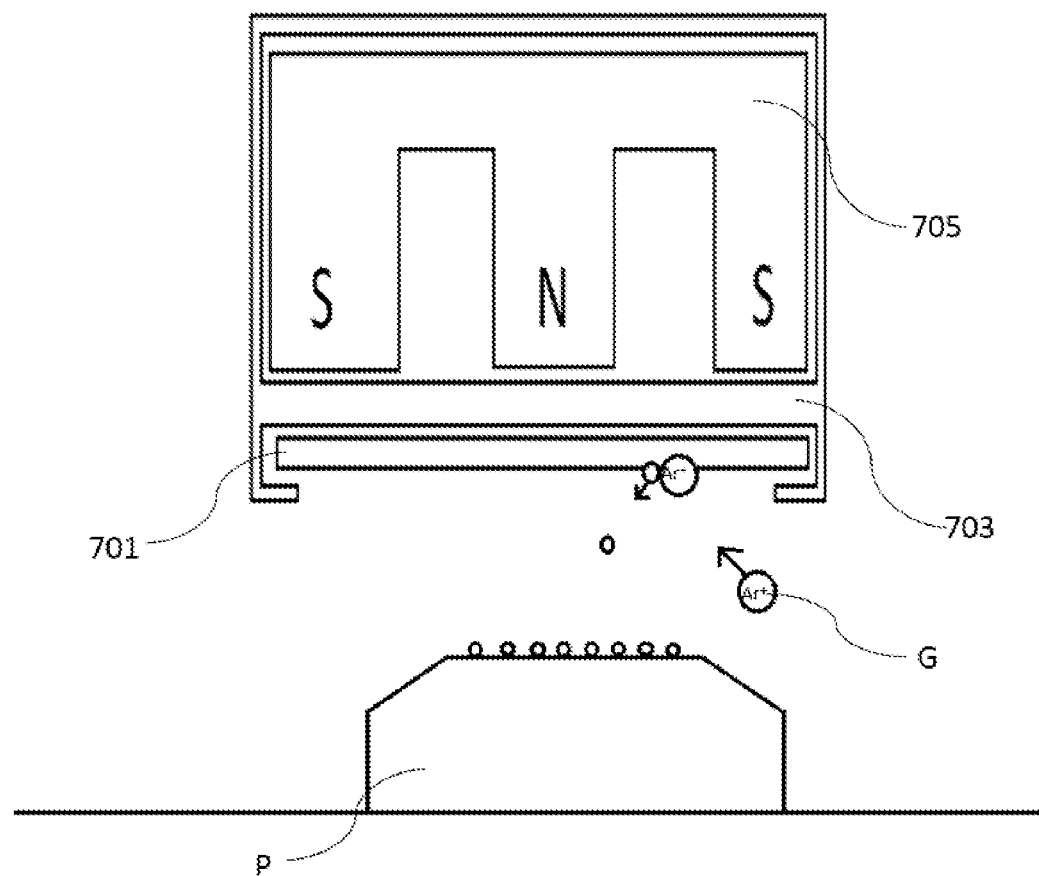
Figure—19
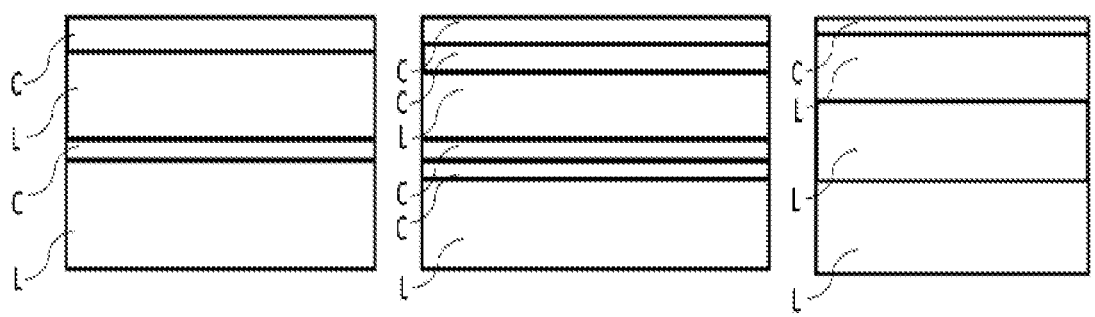
Figure—20

ADDITIVE MANUFACTURING DEVICE

The present invention relates to an additive manufacturing device in which parts are produced by additive manufacturing method.

Additive manufacturing or more commonly known as three-dimensional compression method is a production method in which part to be produced is modelled in a computer environment, then the modelled part geometry is divided into layers in a slicer software, and a final part is produced by depositing these layers on top of each other. Since the additive manufacturing method is a powder-based production method, porosity may occur in the part during part production, and the porosity reduces strength of the part. In order to increase strength of the part, outer surface of the part is coated with various coating methods in a different device after the part is produced.

In Chinese patent document CN107570705, which is included in the known state of the art, magnetic field and magnetic sputtering method enable the additive manufacturing powders to be concentrated around a laser beam and enable the metal additive manufacturing powders to be oriented to a desired direction due to the magnetic field, wherein excess metal powders are collected in a metal powder chamber to avoid manufacturing errors. However, a coating process is not mentioned.

In the known state of the art, the part produced by additive manufacturing method in an additive manufacturing device is placed in a separate coating device after the part production is completed, and outer surface of the part is coated in this device. Coating only the outer surface of the part causes insufficiency in desired mechanic improvements. Moreover, putting the part produced in the additive manufacturing device to another coating device to coat it extends the process times and increases the production complexity.

Thanks to an additive manufacturing device according to the present invention, it is enabled that strength of the part produced by additive manufacturing method is increased.

Another object of the present invention is to reduce the loss of time in the production of parts by the additive manufacturing method and to enable efficient production.

The additive manufacturing device realized to achieve the object of the invention and defined in the first claim and the other claims dependent thereon comprises a body; a table which is located on the body, wherein powders are laid on the table by means of a laying apparatus; at least one layer which is created by sintering or fusing the powders laid on the table; a part which is produced by additive manufacturing method; at least one heat source assembly which is located on the body and enables heat treatment to be applied to the powders laid on the table; at least one sensor which measures position of the heat source assembly and detects operating status thereof; and at least one control unit controlling the heat source assembly based on data received from the sensor.

The additive manufacturing device of the invention comprises a coating applied on at least one layer by magnetic sputtering method; at least one target material which allows the coating atoms to be removed from its surface when a process gas is collided onto the target material; and at least one magnetic sputtering assembly which is located on the body and is triggered by means of the control unit such that it allows at least one layer to be coated by magnetic sputtering method.

In an embodiment of the invention, the additive manufacturing device comprises a sensor for measuring position and detecting operating status of the magnetic sputtering assembly.

In an embodiment of the invention, the additive manufacturing device comprises a control unit which controls the process of applying coating on at least one layer by the magnetic sputtering assembly by using data received from the sensor.

In an embodiment of the invention, the additive manufacturing device comprises a reflecting assembly which allows the body to be vacuumed by means of a pressure regulator, and allows a laser or an electron beam reflected onto the reflecting assembly from the heat source assembly to be sent to the powders on the table by operating by means of the control unit the magnetic sputtering assembly and the heat source assembly which were stopped by the control unit; and a magnetic sputtering assembly which enables a part layer to be created by applying a heat treatment to the additive manufacturing powders on the table with the energy sent from the heat source assembly to the reflecting assembly, wherein the magnetic sputtering assembly applies a coating by magnetic sputtering method on at least one layer predetermined by user and/or software by operating by means of the control unit the magnetic sputtering assembly and the heat source assembly which were stopped by the control unit, and enables the part to be produced by repeating said steps and applying coating on a desired layer.

In an embodiment of the invention, the additive manufacturing device comprises at least one positioner which enables the magnetic sputtering assembly to be positioned at desired angles; a magnetic sputtering body which allows target material and the positioner to be housed therein; at least one adapter which is located on the body and enables the magnetic sputtering assembly to move on the body; a positioner with one of the ends attached to the adapter and the other to the body of magnetic sputtering assembly, wherein the positioner allows the magnetic sputtering assembly to be located at a desired position and/or angle with respect to the table by moving in the direction of the axis that the positioner extends between the ends to which it is attached; a magnet which is provided in the magnetic sputtering assembly and allows a magnetic field to be created from north pole to the south pole; and a magnetic sputtering assembly which allows coating to be applied by colliding the process gas onto the surface of the target material, removing the coating atoms from the surface of the target material and stacking them on at least one layer, wherein the process gas becomes a high-energy positive ion by losing its electron as a result of the collision of free electrons moving on the magnetic field between the poles of the magnet with the process gas electrons.

In an embodiment of the invention, the additive manufacturing device comprises a magnetic sputtering assembly which enables a magnetic sputtering process to be performed by a serial sputtering method or co-sputtering method thanks to confocal cathode sputtering system capacity.

In an embodiment of the invention, the additive manufacturing device comprises a magnetic sputtering assembly which enables a magnetic sputtering process to be performed by any of the serial sputtering or co-sputtering method thanks to confocal cathode sputtering system.

In an embodiment of the invention, the additive manufacturing device comprises a magnetic sputtering assembly which allows a hybrid coating to be applied by using at least two different types of target materials.

In an embodiment of the invention, the additive manufacturing device comprises a magnetic sputtering assembly which enables a hybrid coating to be applied, wherein the hybrid coating is created by depositing at least one nano-sized layer and at least one other nano-sized layer on top of each other in a predetermined order by the user.

In an embodiment of the invention, the additive manufacturing device comprises at least two target materials, one of which is sputtered before the other by the magnetic sputtering method.

In an embodiment of the invention, the additive manufacturing device comprises a target material containing at least two different types of materials with miscible properties; and a magnetic sputtering assembly which enables new alloy coatings to be created by sputtering the target materials simultaneously.

In an embodiment of the invention, the additive manufacturing device comprises at least one power supplier which provides energy to the heat source assembly and/or enables free electrons on the magnetic field to be triggered.

In an embodiment of the invention, the additive manufacturing device comprises a first protective cover located on the body and having an opened position (I) that allows the heat source assembly to apply heat treatment to the powders, and a closed position (II), wherein the first protective cover is brought from the opened position (I) to the closed position (II) after being triggered by means of the control unit, and the first protective cover prevents transmission of heat from the heat source assembly to the powders and is located on the body facing the heat source assembly when in the closed position (II); and at least one connecting element which is located on the body and allows the first protective cover to be located on the body in a movable manner.

In an embodiment of the invention, the additive manufacturing device comprises a second protective cover located on the body and having an opened position (I) that allows the magnetic sputtering assembly to apply coating on at least one layer, and a closed position (II), wherein the second protective cover is brought from the opened position (I) to the closed position (II) after being triggered by means of the control unit, and the second protective cover prevents applying coating on the layer by the magnetic sputtering assembly and is located on the body facing the magnetic sputtering assembly when in the closed position (II); and a connecting element which is located on the body and enables the second protective cover to be located on the body in a movable manner.

In an embodiment of the invention, the additive manufacturing device comprises at least one movement assembly which is provided on the body of the heat source assembly such that it is almost parallel to the plane on which the table is located, wherein the movement assembly enables the heat source assembly to move thereon after the heat source assembly is triggered by means of the control unit, and enables the magnetic sputtering assembly to move thereon after the magnetic sputtering assembly is triggered by means of the control unit.

In an embodiment of the invention, the additive manufacturing device comprises at least one channel which is provided on the body and allows the movement assembly to move therein after the movement assembly is triggered by means of the control unit.

Exemplary embodiments of the additive manufacturing device according to the present invention are illustrated in the attached drawings, in which:

FIG. 19 is a schematic view of magnetic sputtering assembly and the part.

FIG. 20 is a schematic view of the part and coating.

Figure 1:
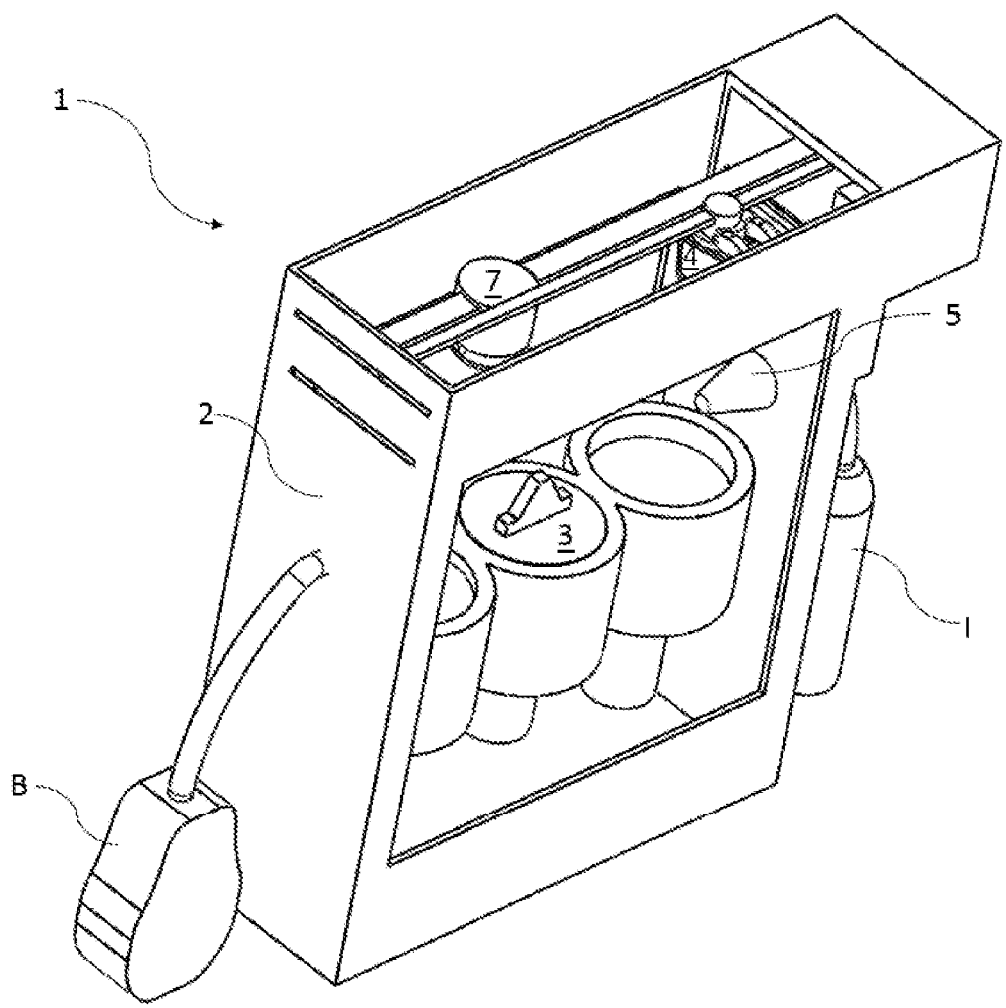
FIG. 1 is a perspective view of an additive manufacturing device.

All the parts illustrated in figures are individually assigned a reference numeral and the corresponding terms of these numbers are listed as follows:

1. Additive manufacturing device
2. Body
3. Table
4. Heat source assembly
5. Sensor
6. Control unit
7. Magnetic sputtering assembly
　701) Target material
　702) Positioner
　703) Magnetic sputtering body
　704) Adapter
　705) Magnet
8. Power supplier
901. First protective cover
902. Second protective cover
10. Connecting element
11. Movement assembly
12. Channel (T) Powder
(S) Laying Apparatus
(L) Layer
(P) Part
(C) Coating
(G) Process gas
(M) Magnetic Field
(E) Free Electrons
(B) Pressure Regulator
(I) Process Gas Source
(Y) Reflecting assembly The additive manufacturing device (1) comprises a body (2); a table (3) which is located on the body (2) and allows powders (T) to be laid thereon by means of a laying apparatus (S); at least one layer (L) which is created by sintering or fusing the powders (T) laid on the table (3); a part (P) which is produced by depositing the layers (L) using additive manufacturing method; at least one heat source assembly (4) which is located on the body (2) and applies heat treatment to the powders (T) laid on the table (3); at least one sensor (5) for measuring position and operating status of the heat source assembly (4); and at least one control unit (6) controlling the heat source assembly (4) based on data received from the sensor (5) (FIG. 1, FIG. 2, FIG. 3).

Figure 2:
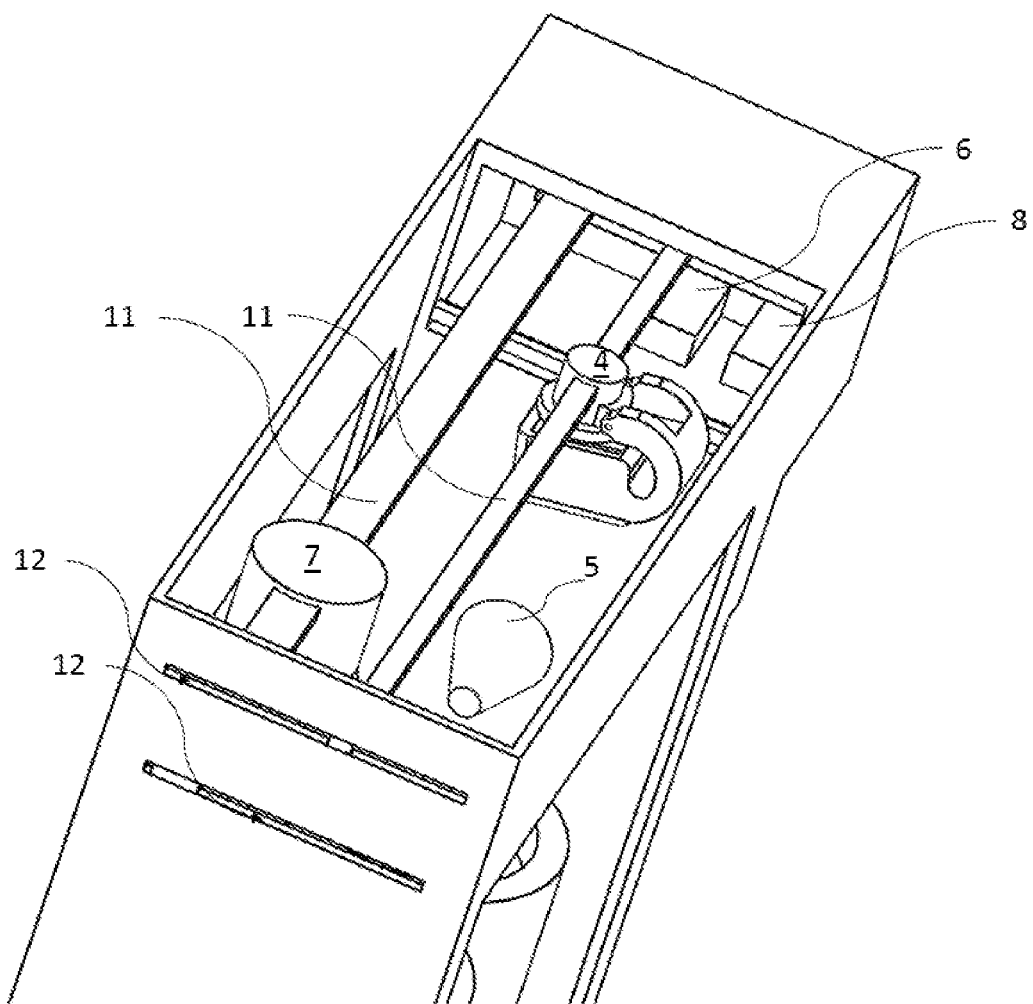
FIG. 2 is a perspective view of an additive manufacturing device.
Figure 3:
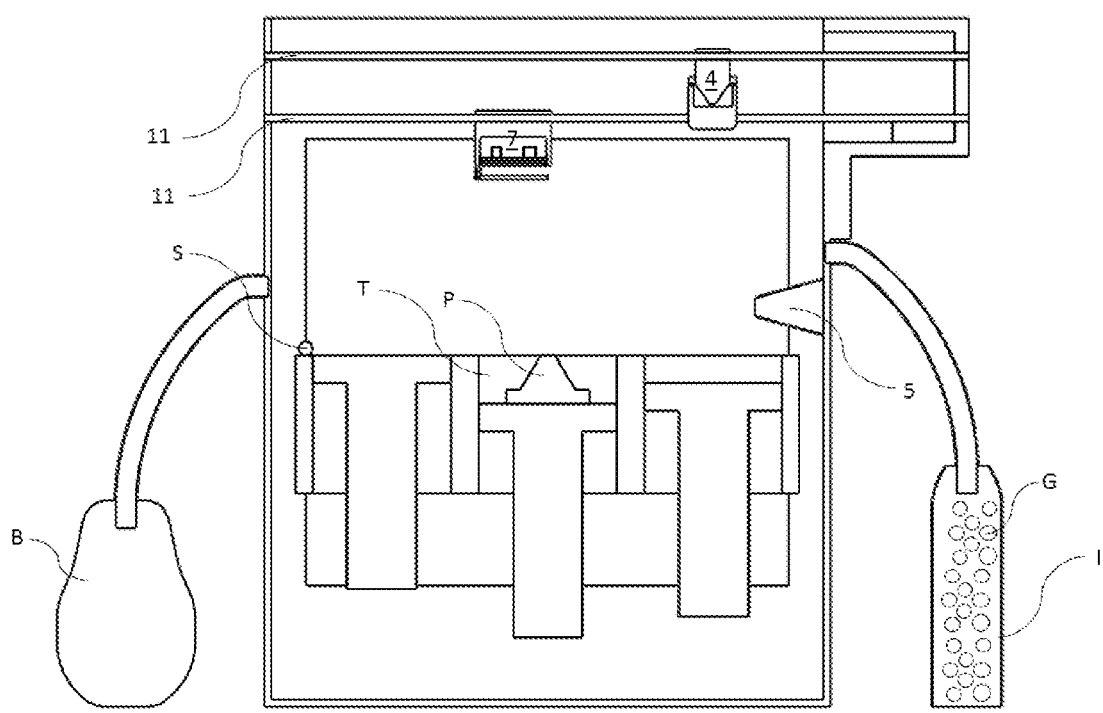
FIG. 3 is a schematic view of an additive manufacturing device.

The additive manufacturing device (1) of the invention comprises a coating (C) applied on at least one layer (L) by magnetic sputtering method; at least one target material (701) which allows the coating (C) atoms to be removed from its surface when a process gas (G) is collided onto the target material (701); and at least one magnetic sputtering assembly (7) which is located on the body (2) and is triggered by means of the control unit (6) such that it allows a coating (C) to be applied on at least one layer (L) by magnetic sputtering method (FIG. 1, FIG. 3, FIG. 19).

The laying apparatus (S) located on the body (2) enables that powders (T) required to create the layer (L) are laid on the table (3), the excess powders (T) other than those required to create the layer (L) are removed from the table (3) and the powders laid on the table (3) are compacted. The part (P) created by depositing at least one layer (L) and the layers (L) is formed by selectively sintering or fusing the part geometry regions of the powders (T) laid on the table (3) with the laser or electron beam sent from the heat source assembly (4). The sensor (5) serves to detect position of the heat source assembly (4) on the body (2), the first position (I) in which it is operated, and the second position (II) in which it is stopped. Control unit (6) controls position, operating status and process parameters of the heat source assembly (4) based on data about position, operating status and other process parameters received from the heat source assembly (4) by means of the sensor (5). Thus, solidification of the powders (T) is performed regularly.

Figure 17:
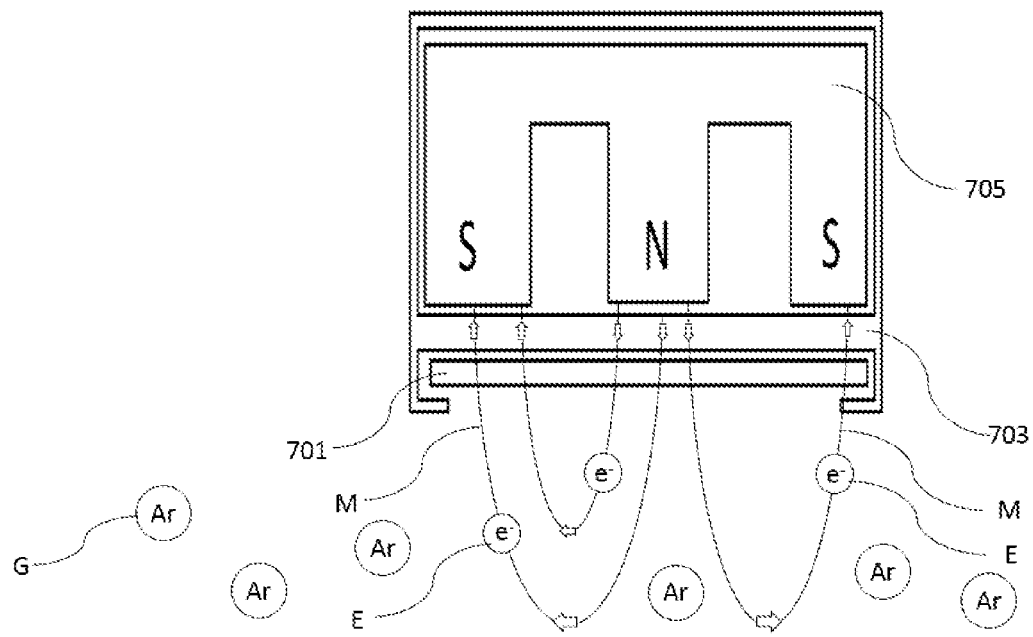
FIG. 17 is a schematic view of magnetic sputtering assembly.
Figure 18:
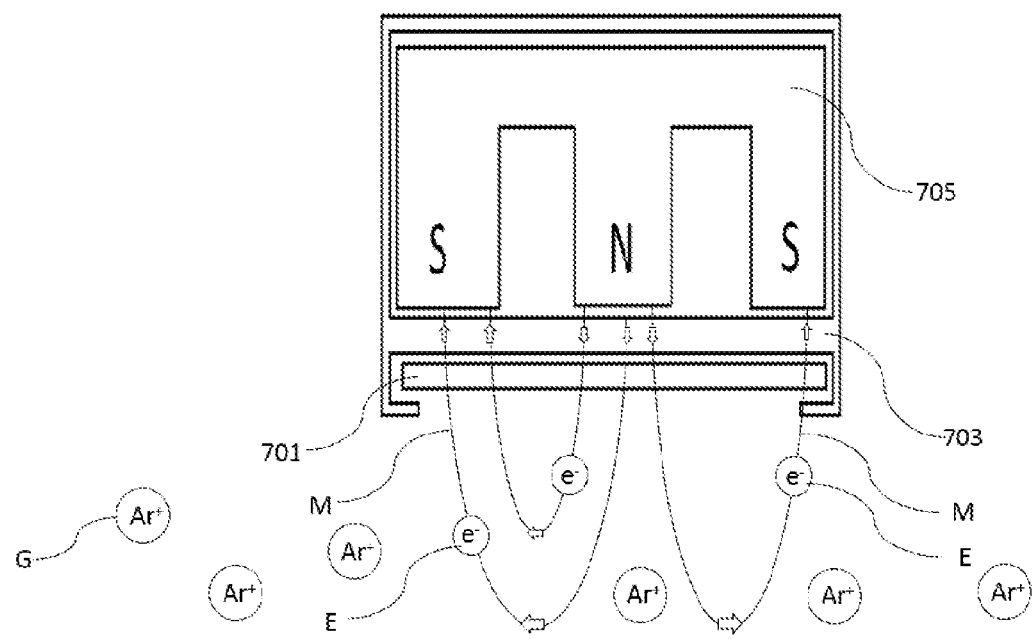
FIG. 18 is a schematic view of magnetic sputtering assembly.

Coating (C) is applied on at least one layer (L) by the magnetic sputtering assembly (7) by magnetic sputtering method. The target material (701) allows coating (C) atoms to be removed from its surface as a result of collision of the high-energy process gas (G) onto the target material (701), wherein the high energy process gas (G) becomes a positive ion after collision of its electrons with free electrons. The magnetic sputtering assembly (7) is located on the body (2) and allows a coating (C) to be applied on at least one layer (L) by magnetic sputtering method as a result of being triggered by means of the control unit (6) (FIG. 17, FIG. 18, FIG. 19).

In an embodiment of the invention, the additive manufacturing device (1) comprises a sensor (5) for measuring position and operating status of the magnetic sputtering assembly (7). The sensor (5) detects position and operating status of the heat source assembly (4) and magnetic sputtering assembly (7), and provides transfer of such data to the control unit (FIG. 3).

In an embodiment of the invention, the additive manufacturing device (1) comprises a control unit (6) which controls the process of applying coating (C) on at least one layer (L) by magnetic sputtering assembly (7) using data received from the sensor (5). The control unit (6) enables that the heat source assembly (4) and the magnetic sputtering assembly (7) are controlled and operated in harmony (FIG. 2, FIG. 3).

In an embodiment of the invention, the additive manufacturing device (1) comprises a reflecting assembly (Y) which enables the body (2) to be vacuumed by means of a pressure regulator (B), and enables a laser or an electron beam reflected onto the reflecting assembly (Y) from the heat source assembly (4) to be directed to the powders (T) on the table (3) by triggering, by means of the control unit (6), the magnetic sputtering assembly (7) and the heat source assembly (4) which were stopped by the control unit (6); and a magnetic sputtering assembly (7) which enables a part (P) layer (L) to be created by applying a heat treatment to the additive manufacturing powders (T) on the table (3) with the energy sent from the heat source assembly (4) to the reflecting assembly (Y), wherein the magnetic sputtering assembly (7) applies a coating (C) by magnetic sputtering method on at least one layer (L) predetermined by user and/or software as a result of triggering, by means of the control unit (6), the magnetic sputtering assembly (7) and the heat source assembly (4) which were stopped by means of the control unit (6), and allows the part (P) to be produced by repeating said steps and applying coating (C) on a desired layer (L). When the body is vacuumed, undesirable gases in the environment that may cause reaction are evacuated. Thus, process efficiency and effectiveness are increased. The ability to coat a predetermined and desired layer improves the micro and macro mechanical properties of the part. Layers (L) and coating (C) thicknesses for which the coating (C) will be effective and efficient will be determined by finite elements and molecular dynamics analysis predetermined by the user and/or software, a coating (C) with a determined thickness will be applied on the determined layers (L), and thus, parts with high strength will be produced by combining the production of an effective and efficient layer (L) and the application of the coating (C). The target materials (701) that can be used for magnetic sputtering process can be materials such as zirconium, niobium, gold, silver, aluminium. Vacuum pressure can usually be between 10 and 100 mTorr (FIG. 3, FIG. 6, FIG. 7, FIG. 9, FIG. 10, FIG. 14, FIG. 20).

In an embodiment of the invention, the additive manufacturing device (1) comprises at least one positioner (702) which enables the magnetic sputtering assembly (7) to be positioned at different angles; a magnetic sputtering body (703) housing the target material (701) and the positioner (702); at least one adapter (704) which is located on the body (2) and allows the magnetic sputtering assembly (7) to move on the body (2); a positioner (702) with one of the ends attached to the adapter (704) and the other to the body (703) of magnetic sputtering assembly, wherein the positioner (702) allows the magnetic sputtering assembly (7) to be located at a desired position and/or angle with respect to the table (3) by moving along the axis that the positioner (702) extends in its entire length between the ends to which it is attached; a magnet (705) which is located in the magnetic sputtering assembly (7) and enables a magnetic field to be created from north pole (N) to the south pole (S); and a magnetic sputtering assembly (7) which enables coating (C) to be applied by colliding the process gas (G) onto the target material (701), removing the coating (C) atoms from the surface of the target material (701) and depositing them on at least one layer (L), wherein the process gas (G) becomes a high-energy positive ion by losing its electron as a result of colliding with free electrons (E) moving in the magnetic field (M) between the poles of the magnet (705). The positioner (702) is able to use a vacuum system, and thus, enables that the adapter (704) and the magnetic sputtering body (703), which are the ends to which it is connected, are in contact and hold effectively and reliably, and also prevents possible vibrations that may occur. Positioners (702) enable the magnetic sputtering assembly (7) to be located at a desired position and/or angle, thus enabling the process to be carried out effectively and efficiently. The positioner (702) can also comprise conventional mechanical joints as well as the vacuum system. The magnetic sputtering body (703) is charged with ground voltage while the target material (701) is charged with negative voltage (−). Negative voltage causes the free electrons (E) on the magnetic field (M) to move away from the target material (701). Free electrons (E) that have moved away from the target material (701) collide with electrons of the process gas (G). As a result of such a collision effect, one electron of the process gas (G) is removed and the process gas (G) is charged with a positive (+) charge. Positively (+) charged process gas (G) is directed towards negatively (−) charged target material (701) with a high energy, and removes the coating (C) atoms from the surface of the target material (701) as per the principle of conservation of momentum. The removed atoms of target material (701) deposit on the surface of the layer (L) and the coating (C) is made, accordingly (FIG. 8, FIG. 9, FIG. 10, FIG. 11, FIG. 15, FIG. 16, FIG. 17, FIG. 18, FIG. 19).

Figure 8:
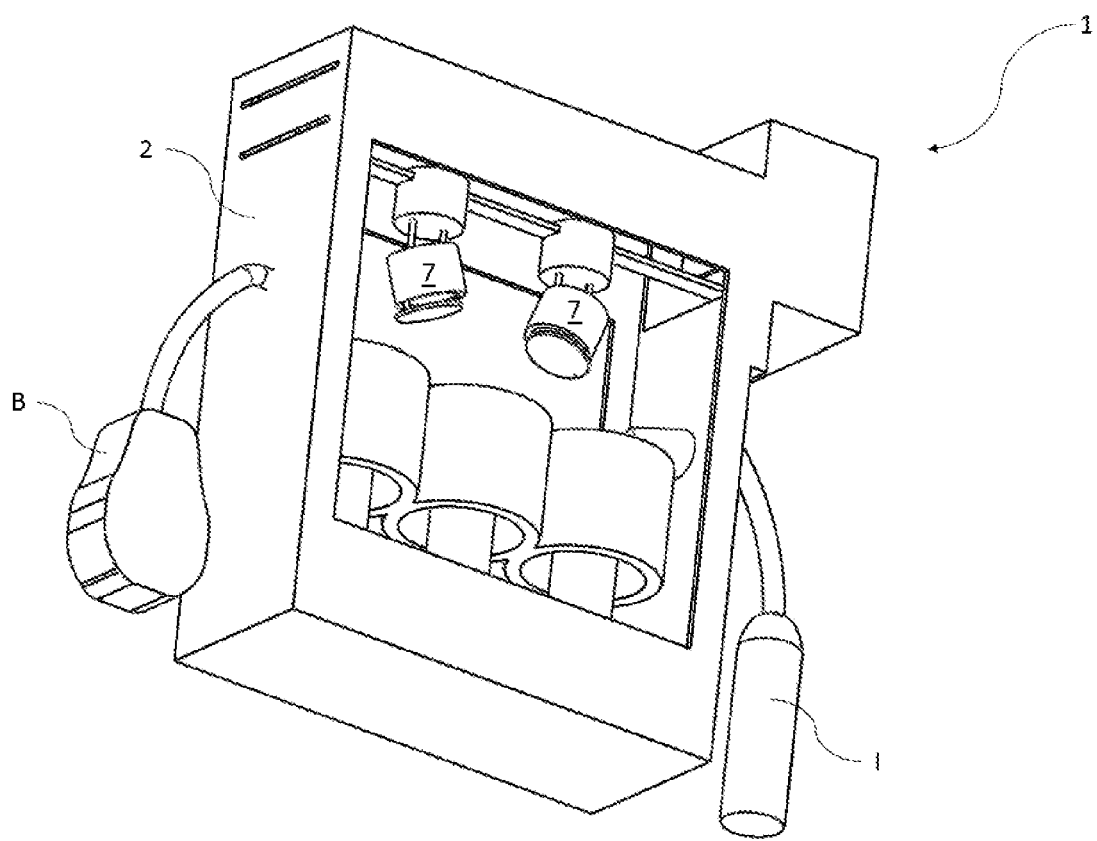
FIG. 8 is a perspective view of an additive manufacturing device.
Figure 9:
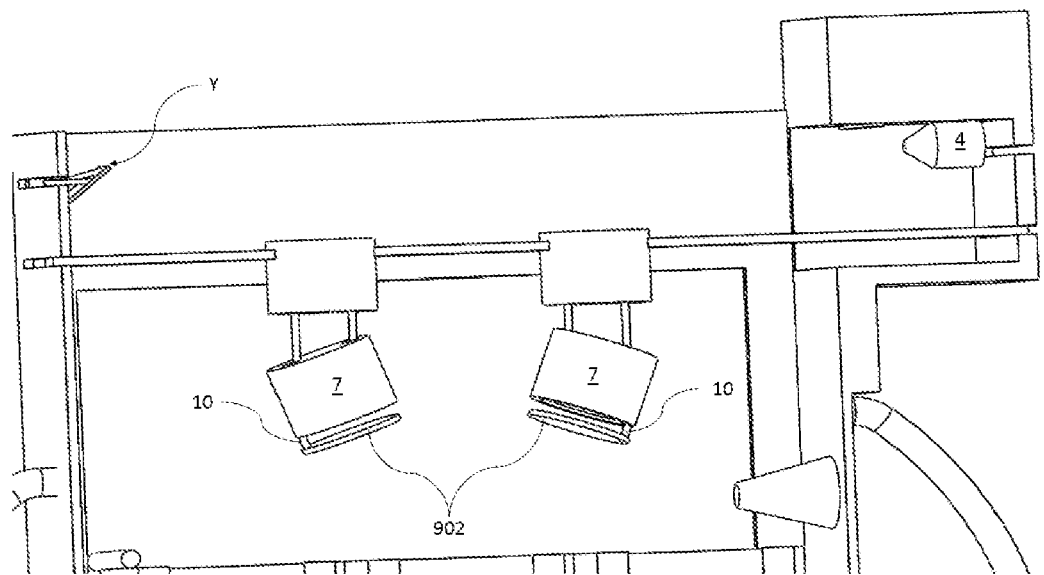
FIG. 9 is a schematic view of heat source assembly and magnetic sputtering assembly when the first protective cover is in the opened position (I) and the second protective cover is in the closed position (II).
Figure 10:
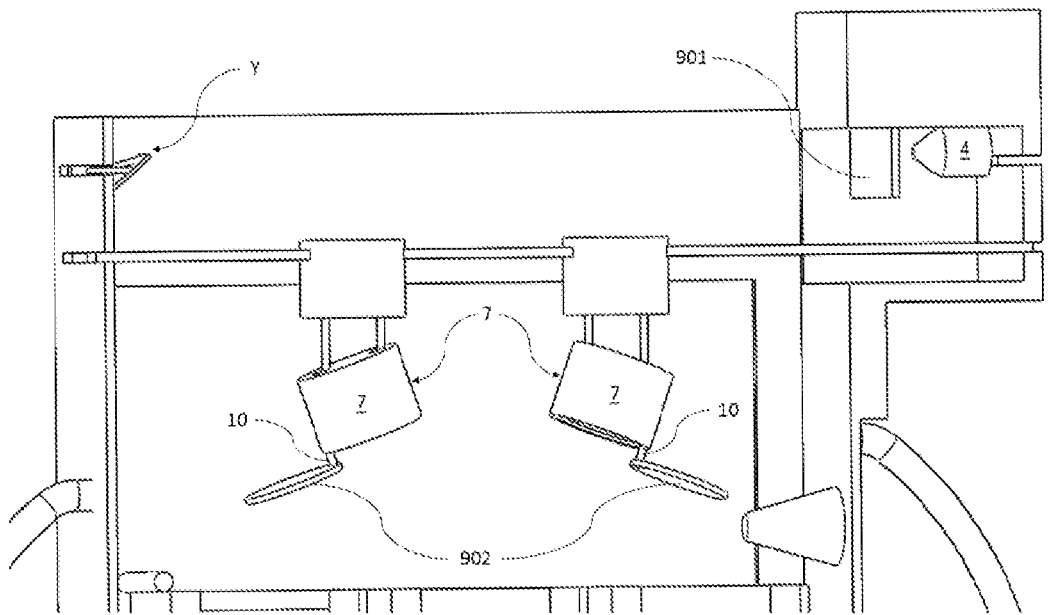
FIG. 10 is a schematic view of heat source assembly and magnetic sputtering assembly when the first protective cover is in the closed position (II) and the second protective cover is in the opened position (I).
Figure 11:
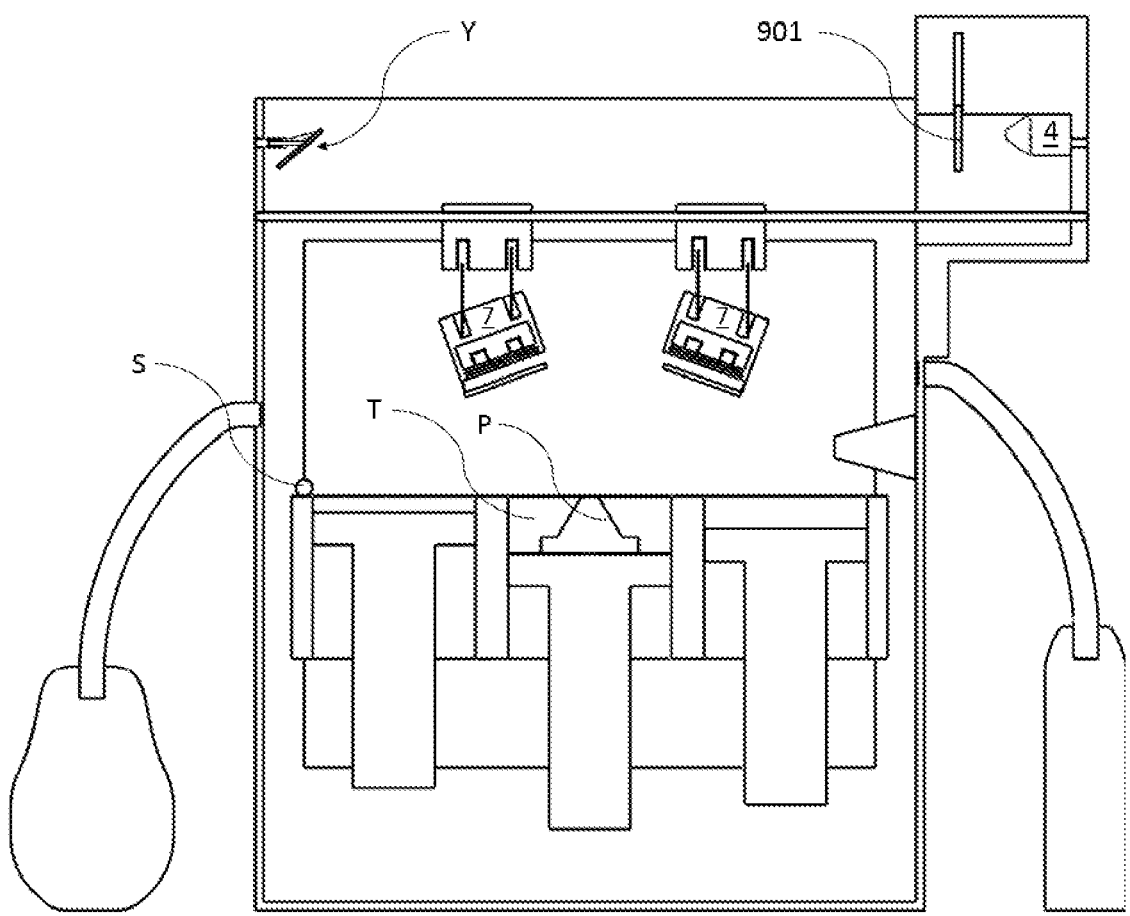
FIG. 11 is a schematic view of an additive manufacturing device.
Figure 12:
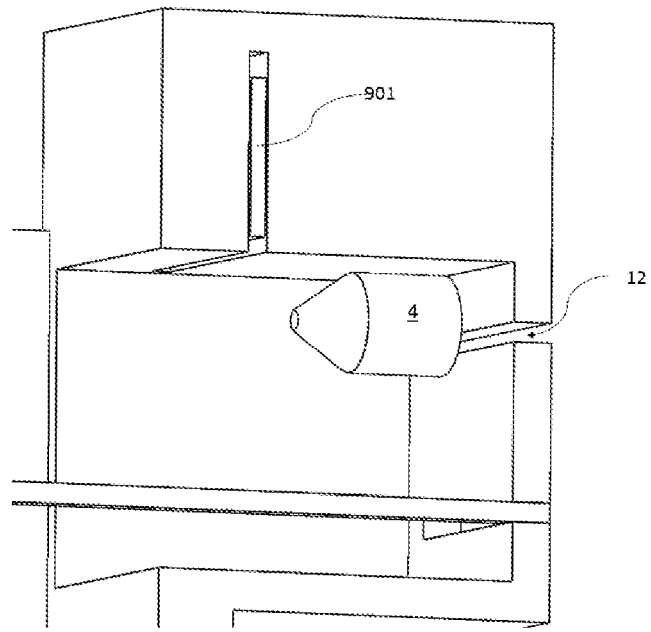
FIG. 12 is a schematic view of heat source assembly when the first protective cover is in the opened position (I).
Figure 13:
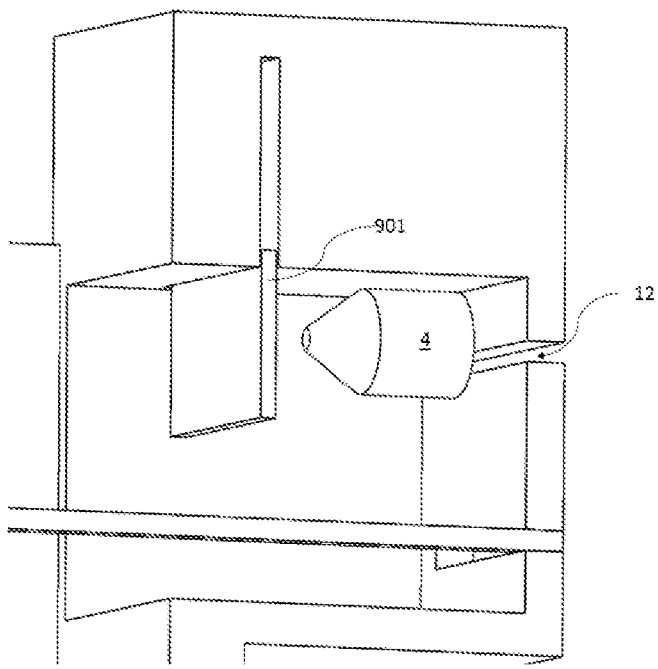
FIG. 13 is a schematic view of heat source assembly when the first protective cover is in the closed position (II).

In an embodiment of the invention, the additive manufacturing device (1) comprises a magnetic sputtering assembly (7) which can perform a magnetic sputtering process with a serial sputtering method or co-sputtering method thanks to confocal cathode sputtering system. With the serial magnetic sputtering process, multi-layer coatings (C) can be applied in a desired order with desired coating (C) materials. In addition, new coating (C) alloys can be obtained with co-sputtering method (FIG. 8, FIG. 11).

In an embodiment of the invention, the additive manufacturing device (1) comprises a magnetic sputtering assembly (7) which can apply a hybrid coating (C) by using at least two different types of target materials (701). Therefore, more effective and efficient coatings can be applied on the layers (L) with hybrid coatings (C) containing multiple material types.

Figure 15:
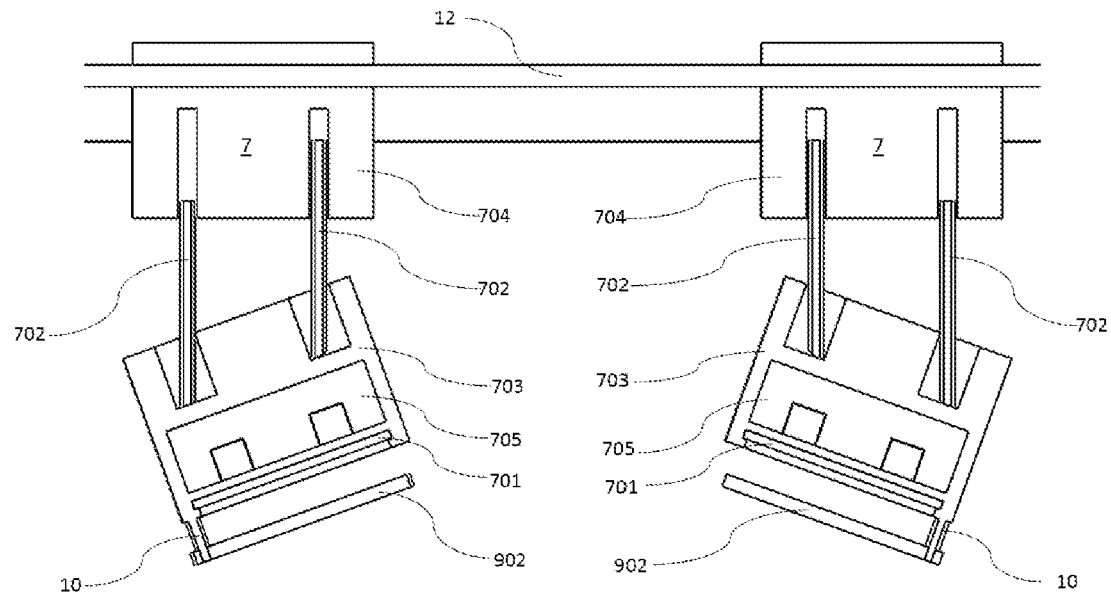
FIG. 15 is a schematic view of magnetic sputtering assembly when the second protective cover is in the closed position (II).
Figure 16:
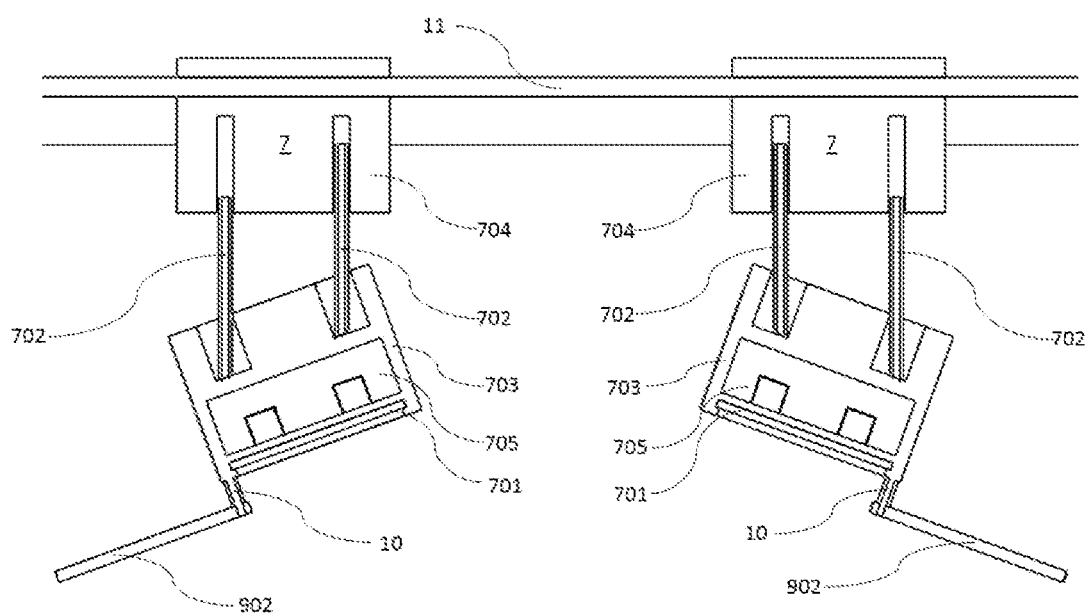
FIG. 16 is a schematic view of magnetic sputtering assembly when the second protective cover is in the opened position (I).

In an embodiment of the invention, the additive manufacturing device (1) comprises a magnetic sputtering assembly (7) which can apply a hybrid coating (C) that is created by depositing at least one nano-sized layer (L) and at least one other nano-sized layer (L) coatings (C) on top of each other in a predetermined order by the user. Therefore, effective and efficient coatings can be applied according to the desired target materials (701) and the desired depositing order (FIG. 8, FIG. 15, FIG. 16).

In an embodiment of the invention, the additive manufacturing device (1) comprises at least two target materials (701), one of which is sputtered before the other by the magnetic sputtering method. Therefore, effective and efficient multi-layer coatings can be applied with target materials (701) having immiscible properties.

In an embodiment of the invention, the additive manufacturing device (1) comprises a target material (701) containing at least two different types of materials with miscible properties; and a magnetic sputtering assembly (7) which allows new alloy coatings to be created by sputtering the target materials (701) simultaneously. Having ability to create new alloy coatings enables application of new alloy coatings containing different components in different proportions. New alloy coatings will provide an effective and efficient coating for the part (FIG. 8, FIG. 15, FIG. 16).

Figure 6:
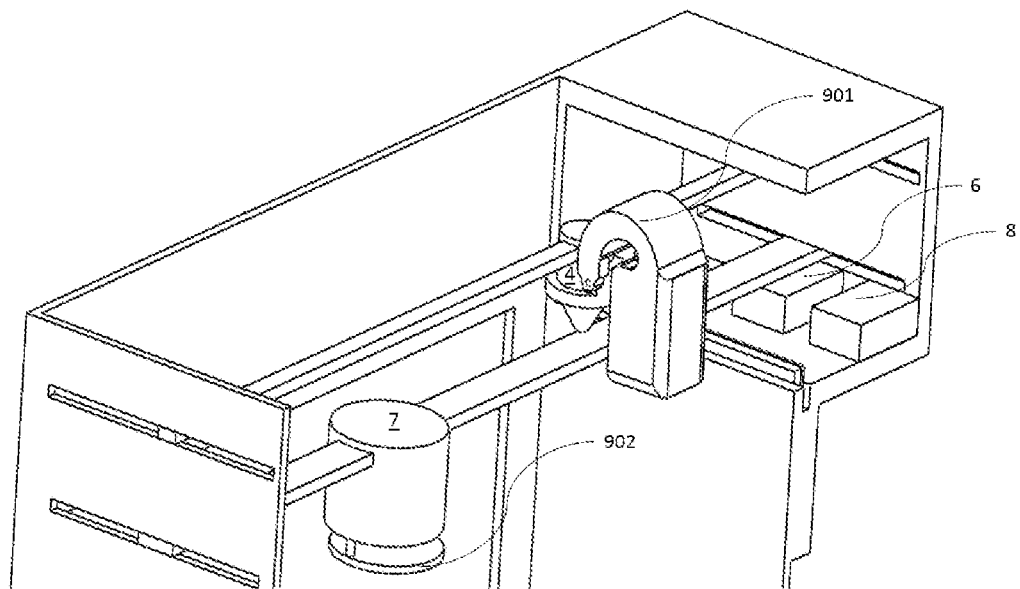
FIG. 6 is a schematic view of heat source assembly and magnetic sputtering assembly when the first protective cover is in the opened position (I) and the second protective cover is in the closed position (II).
Figure 7:
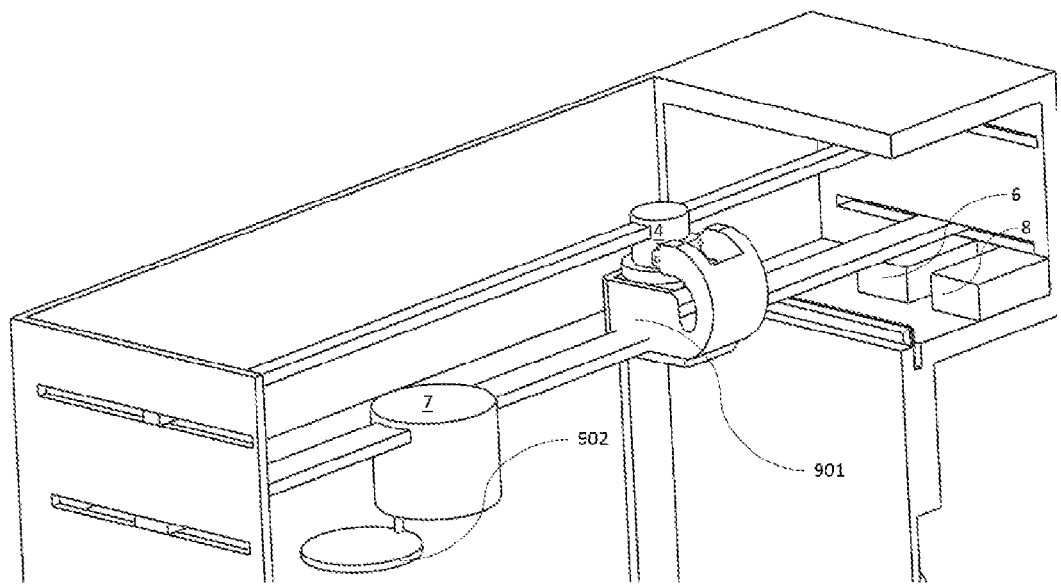
FIG. 7 is a schematic view of heat source assembly and magnetic sputtering assembly when the first protective cover is in the closed position (II) and the second protective cover is in the opened position (I).

In an embodiment of the invention, the additive manufacturing device (1) comprises at least one power supplier (8) which energises the heat source assembly (4) and/or triggers free electrons (E) in the magnetic field (M). The power supplier (8) provides energy required for the heat source assembly (4) to operate. Due to the power supplier (8) charging the magnetic sputtering body (703) with neutral charge and the target material (701) with a variable amount of negative potential energy, nano-sized or micro-sized coatings having a size predetermined by the user and/or software can be applied on the layer (L) (FIG. 6, FIG. 17).

In an embodiment of the invention, the additive manufacturing device (1) comprises a first protective cover (901) located on the body (2) and having an opened position (I) that allows the heat source assembly (4) to apply heat treatment to the powders (T), and a closed position (II), wherein the first protective cover (901) is brought from the opened position (I) to the closed position (II) after being triggered by means of the control unit (6), and the first protective cover (901) prevents transmission of heat from the heat source assembly (4) to the powders (T) and is located on the body (2) facing the heat source assembly (4) when in the closed position (II); and at least one connecting element (10) which is located on the body (2) and allows the first protective cover (901) to be located on the body (2) in a movable manner. The first protective cover (901) and the second protective cover (902) have geometry to protect the heat source assembly (4) and the magnetic sputtering device (7) from external factors such as heat, process gas (G) and coating (C) atoms that may be harmful for the assembly; and have the ability to move appropriately. Therefore, while one of the devices is operating, the other assembly is protected from harmful external factors (FIG. 4, FIG. 5, FIG. 10, FIG. 11, FIG. 12, FIG. 13).

In an embodiment of the invention, the additive manufacturing device (1) comprises a second protective cover (902) located on the body (2) and having an opened position (I) that allows the magnetic sputtering assembly (7) to apply coating (C) on at least one layer (L), and a closed position (II), wherein the second protective cover (902) is brought from the opened position (I) to the closed position (II) after being triggered by means of the control unit (6), and the second protective cover (902) prevents applying coating (C) on the layer (L) by the magnetic sputtering assembly (7) and is located on the body (2) facing the magnetic sputtering assembly (7) when in the closed position (II); and a connecting element (10) which is located on the body (2) and allows the second protective cover (902) to be located on the body (2) in a movable manner. The first protective cover (901) and the second protective cover (902) have geometry to protect the heat source assembly (4) and the magnetic sputtering device (7) from external factors such as heat, process gas (G) and coating (C) atoms that may be harmful for the assembly; and have the ability to move appropriately. Therefore, while one of the devices is operating, the other assembly is protected from harmful external factors (FIG. 4, FIG. 5, FIG. 10, FIG. 11, FIG. 12, FIG. 13).

In an embodiment of the invention, the additive manufacturing device (1) comprises at least one movement assembly (11) which is provided on the body (2) of the heat source assembly (4) such that it is almost parallel to the plane on which the table (3) is located, wherein the movement assembly (11) allows the heat source assembly (4) to move thereon after the heat source assembly (4) is triggered by means of the control unit (6), and allows the magnetic sputtering assembly (7) to move thereon after the magnetic sputtering assembly (7) is triggered by means of the control unit (6). Therefore, the heat source assembly (4) and the magnetic sputtering assembly (7) can be located in positions where the efficiency and efficiency of the boiling and coating processes are high (FIG. 2, FIG. 3, FIG. 4, FIG. 14).

Figure 4:
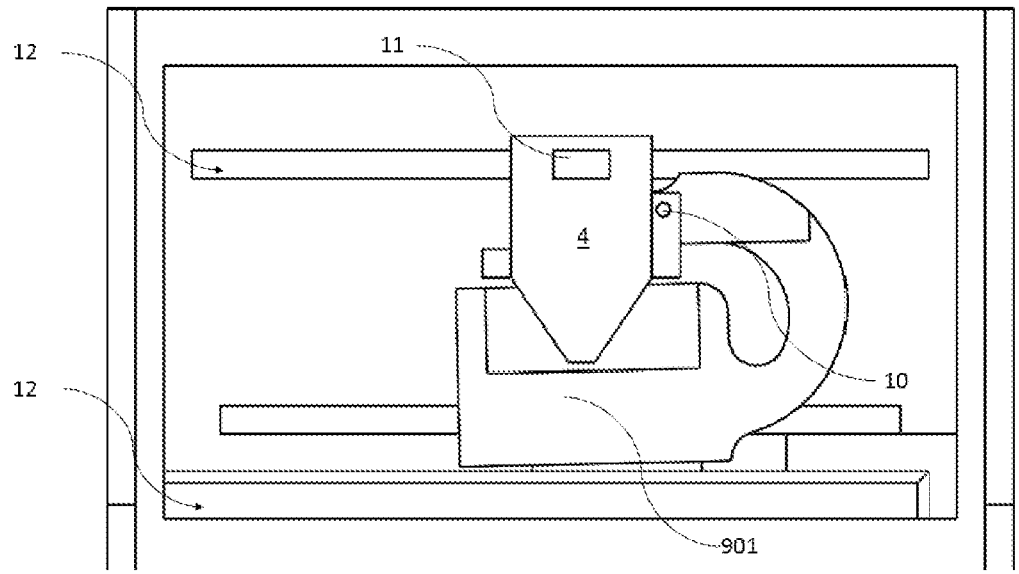
FIG. 4 is a schematic view of heat source assembly when the first protective cover is in the closed position (II).
Figure 5:
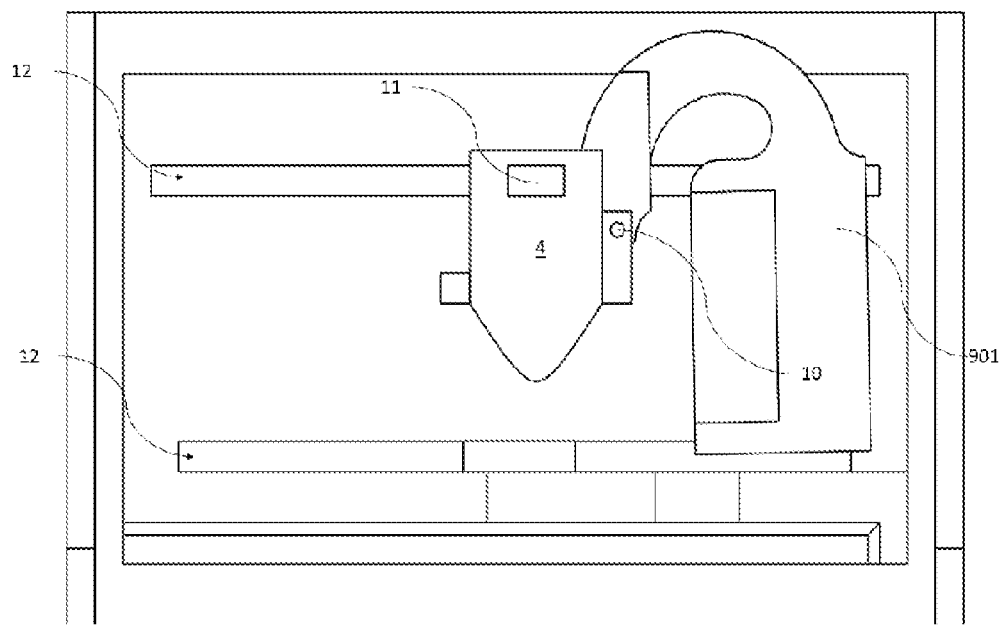
FIG. 5 is a schematic view of heat source assembly when the first protective cover is in the opened position (I).
Figure 14:
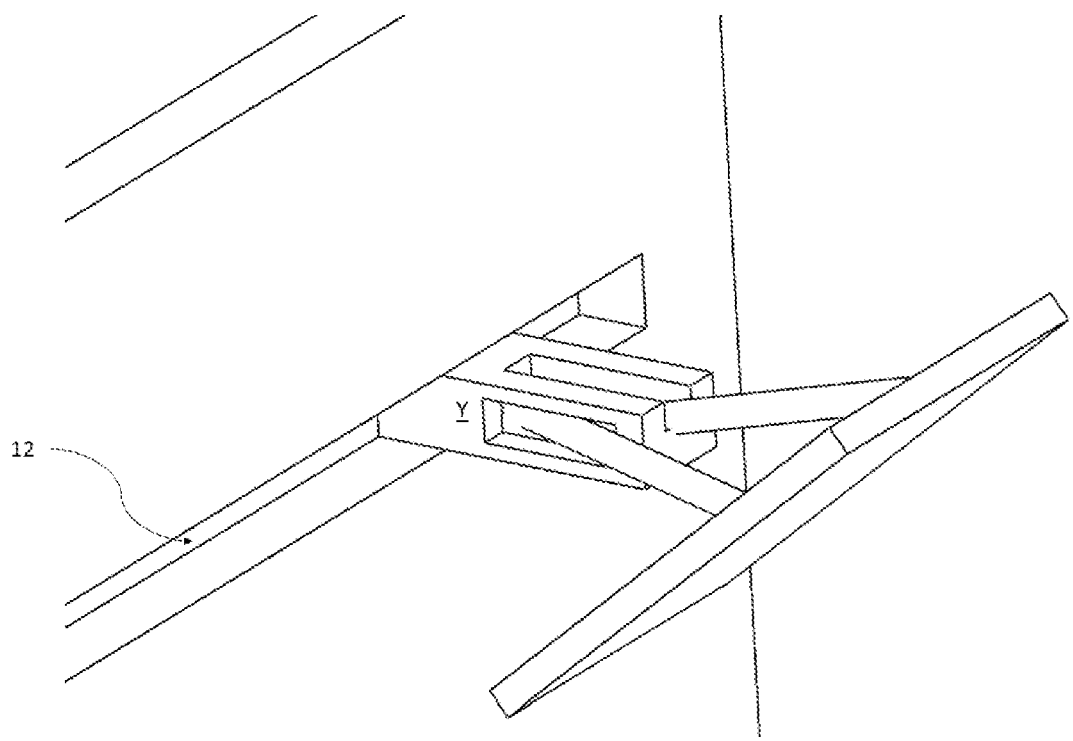
FIG. 14 is a perspective view of reflecting assembly.

In an embodiment of the invention, the additive manufacturing device (1) comprises at least one channel (12) which is provided on the body and allows the movement assembly (11) to move therein after the movement assembly (11) is triggered by means of the control unit (6). The movement assembly (11) is able to move in the channel (12), and thus, the heat source assembly (4) and the magnetic sputtering assembly (7) can be located in positions where the boiling and coating processes are effective and efficient (FIG. 2, FIG. 4, FIG. 14).

The invention claimed is:

1. An additive manufacturing device comprising:
   a body;
   a table which is located on the body and allows powders to be laid thereon by a laying apparatus;
   at least one layer which is created by sintering or fusing the powders laid on the table;
   a part which is produced by depositing the layers using additive manufacturing;
   a heat source assembly which is located on the body and applies heat treatment to the powders laid on the table;
   a first sensor for measuring a position and an operating status of the heat source assembly;
   a control unit controlling the heat source assembly based on data received from the first sensor;
   a coating applied on the at least one layer by magnetic sputtering;
   a target material which allows atoms of the coating to be removed from a surface thereof when a process gas is collided onto the target material;
   a magnetic sputtering assembly which is located on the body and is triggered by the control unit so that the coating is applied on the at least one layer by magnetic sputtering;
   a positioner configured to position the magnetic sputtering assembly at different angles;
   a magnetic sputtering body housing the target material and the positioner;
   at least one adapter which is located on the body so that the magnetic sputtering assembly moves on the body;
   wherein a first end of the positioner is attached to the adapter and a second end thereof is attached to the magnetic sputtering body, wherein the positioner is configured to locate the magnetic sputtering assembly at a desired position and/or angle with respect to the table by moving along a south pole of a magnet in the magnetic supporting body; and
   wherein the magnetic sputtering assembly is configured so that the coating is applied by colliding the process gas onto the target material, removing atoms of the coating from the surface of the target material and depositing them on at least one layer, wherein the process gas becomes a high-energy positive ion by losing its electron as a result of colliding with free electrons moving in the magnetic field between the north pole and the south pole of the magnet.

2. The additive manufacturing device according to claim 1, comprising a second sensor for measuring a position and an operating status of the magnetic sputtering assembly.

3. The additive manufacturing device according to claim 2, wherein the control unit controls application of the coating on at least one layer by magnetic sputtering assembly using data received from the second sensor.

4. The additive manufacturing device according to claim 1, comprising:
   a reflecting assembly which enables the body to be vacuumed by a pressure regulator, and enables a laser or an electron beam reflected onto the reflecting assembly from the heat source assembly to be directed to the powders on the table by triggering, by the control unit, the magnetic sputtering assembly and the heat source assembly which were stopped by the control unit.

5. The additive manufacturing device according to claim 1, wherein the magnetic sputtering assembly is configured to perform a magnetic sputtering process with serial sputtering or co-sputtering.

6. The additive manufacturing device according to claim 1, wherein the magnetic sputtering assembly is configured to apply a hybrid coating by using at least two different types of the target material.

7. The additive manufacturing device according to claim 1, wherein the magnetic sputtering assembly is configured to apply a hybrid coating that is created by depositing at least one nano-sized layer and at least one other nano-sized layer coatings on top of each other in an order predetermined by a user.

8. The additive manufacturing device according to claim 1, comprising at least two target materials, one of the at least two target materials being sputtered before another of the at least two target materials by magnetic sputtering.

9. The additive manufacturing device according to claim 1, wherein the target material contains at least two different types of materials with miscible properties; and a plane on which the table is located, wherein the movement assembly allows the heat source assembly to move thereon after the heat source assembly is triggered by the control unit, and allows the magnetic sputtering assembly to move thereon after the magnetic sputtering assembly is triggered by the control unit.

10. The additive manufacturing device according to claim 1, comprising at least one power supplier which energizes the heat source assembly and/or triggers free electrons in the magnetic field.

11. The additive manufacturing device according to claim 1, comprising:
    a first protective cover located on the body and having an opened position that allows the heat source assembly to apply the heat treatment to the powders, and a closed position, wherein the first protective cover is brought from the opened position to the closed position after being triggered by the control unit, and wherein the first protective cover prevents transmission of heat from the heat source assembly to the powders and is located on the body facing the heat source assembly when in the closed position (II); and
    at least one connecting element which is located on the body and allows the first protective cover to be located on the body in a movable manner.

12. The additive manufacturing device according to claim 1, comprising:
- a second protective cover located on the body and having an opened position that allows the magnetic sputtering assembly to apply the coating on the layer, and a closed position, wherein the second protective cover is brought from the opened position to the closed position after being triggered by the control unit, and wherein the second protective cover prevents applying the coating on the layer by the magnetic sputtering assembly and is located on the body facing the magnetic sputtering assembly when in the closed position; and
- a connecting element which is located on the body and allows the second protective cover to be located on the body in a movable manner.

13. The additive manufacturing device according to claim 1, comprising at least one movement assembly which is provided on the body of the heat source assembly such that it is almost parallel to a plane on which the table is located, wherein the movement assembly allows the heat source assembly to move thereon after the heat source assembly is triggered by the control unit, and allows the magnetic sputtering assembly to move thereon after the magnetic sputtering assembly is triggered by the control unit.

14. The additive manufacturing device according to claim 13, comprising at least one channel which is provided on the body and allows the movement assembly to move therein when the movement assembly is triggered by the control unit.

* * * * *